(12) United States Patent
Moon

(10) Patent No.: US 7,683,411 B2
(45) Date of Patent: Mar. 23, 2010

(54) IMAGE SENSOR AND METHOD OF MANUFACTURING THE SAME

(75) Inventor: Sang-Tae Moon, Seo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/263,483

(22) Filed: Nov. 2, 2008

(65) Prior Publication Data

US 2009/0114965 A1  May 7, 2009

(30) Foreign Application Priority Data

Nov. 5, 2007  (KR) .................. 10-2007-0112157

(51) Int. Cl.
*H01L 31/0232* (2006.01)

(52) U.S. Cl. .................. 257/294; 257/E27.133; 257/E31.127; 438/69

(58) Field of Classification Search ............... 257/294, 257/E27.133, E27.134, E27.15, E27.151, 257/E31.11, E31.127; 438/66, 69, 70
See application file for complete search history.

(56) References Cited

U.S. PATENT DOCUMENTS

2006/0043515 A1 * 3/2006 Ford .................. 257/436
2008/0038862 A1 * 2/2008 Yin et al. .............. 438/69

* cited by examiner

*Primary Examiner*—Minh-Loan T Tran
*Assistant Examiner*—W. Wendy Kuo
(74) *Attorney, Agent, or Firm*—Sherr & Vaughn, PLLC

(57) ABSTRACT

An image sensor and a method of manufacturing the same that includes providing a semiconductor substrate having a photodiode, forming a color filter over the photodiode, forming a micro lens over the color filter and then forming at least one metal layer vertically extending through the microlens at an outer edge thereof.

20 Claims, 2 Drawing Sheets

IMAGE SENSOR AND METHOD OF MANUFACTURING THE SAME

Figure 1:
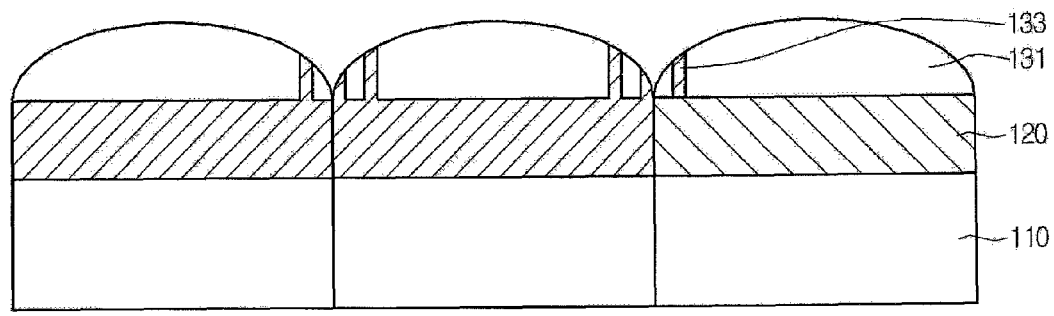

The present application claims priority under 35 U.S.C. §119 to Korean Patent Application No. 2007-0112157 (filed on Nov. 5, 2007), which is hereby incorporated by reference in its entirety.

BACKGROUND

Image sensors are semiconductor devices which convert an optical image into an electrical signal. Image sensors may be divided into change coupled device (CCD) image sensors and complementary metal oxide silicon (CMOS) image sensors (CIS).

A CMOS image sensor includes a photo diode and a MOS transistor in each of unit pixels, and thus, sequentially detects electrical signals of the respective unit pixels in a switching mode, thereby displaying an image. A CMOS image sensor is divided into photo diode regions, receive a light signal and converts the light signal into an electric signal, and transistor regions, which process the electric signal. In a CMOS image sensor, micro lenses for light concentration are formed on and/or over the upper end of the sensor. The micro lenses are made of an organic material, and are completed through processes, such as a photo etching process (PEP) and a reflow process.

However, the organic material has weak mechanical characteristics, and thus is sensitive to defects. Foreign substances are generated during a subsequent process after the formation of the micro lenses and are attached to the micro lenses, thereby causing a malfunction of the CMOS image sensor. Further, CMOS image sensor may generate image interference due to crosstalk between pixels.

SUMMARY

Embodiments relate to an image sensor and a method of manufacturing the image sensor in which micro lenses are formed through a photo etching process (PEP) and a polishing process after the application of an oxide, instead of a photo etching process (PEP) and a reflow process after the application of an organic material.

Embodiments relate to an image sensor and a method of manufacturing the image sensor which prevents crosstalk generated between pixels.

Embodiments relate to an image sensor that may include at least one of the following: an interlayer insulating film formed on and/or over a substrate including photo diodes; a color filter layer formed on and/or over the interlayer insulating film; and micro lenses formed on and/or over the color filter layer and provided with a metal buried layer vertically interposed therein. In accordance with embodiments, the micro lenses are made of silicon oxide ($SiO_2$), and at least one metal buried layer is formed on the edge region of each of the micro lenses.

Embodiments relate to a device that may include at least one of the following: an interlayer insulating film formed over a substrate including photo diodes; a color filter layer formed over the interlayer insulating film; a micro lens array formed over the color filter layer; and a metal layer vertically extending through each microlens in the microlens array.

Embodiments relate to a device that may include at least one of the following: a semiconductor substrate having a photodiode; a color filter formed over and corresponding to the photodiode; a micro lens formed over and corresponding to the color filter layer; and at least one metal layer formed vertically extending through the microlens at an outer edge thereof.

Embodiments relate to a method of manufacturing an image sensor that may include at least one of the following: forming an interlayer insulating film on and/or over a substrate including photo diodes; forming a color filter layer on and/or over the interlayer insulating film; and forming micro lenses provided with a metal vertically interposed therein on and/or over the color filter layer. In accordance with embodiments, the formation of the micro lenses includes depositing an oxide on and/or over the color filter layer; forming a photosensitive film pattern on and/or over the oxide to etch portions of the oxide corresponding to edge regions of the micro lenses; forming at least one trench at each of portions of the oxide through etching using the photosensitive film pattern as an etching mask; filling the at least one trench with the metal; and forming the micro lenses provided with the metal interposed in the edge regions thereof by polishing the oxide filled with the metal.

Embodiments relate to a method of manufacturing an image sensor that may include at least one of the following: providing a semiconductor substrate having a photodiode; and then forming a color filter over the photodiode; and then forming a micro lens over the color filter; and then forming at least one metal layer vertically extending through the microlens at an outer edge thereof.

DRAWINGS

Example FIGS. 1 to 4 illustrate an image sensor and a method for manufacturing an image sensor in accordance with embodiments.

DESCRIPTION

Although embodiments describe the structure of a CMOS image sensor, such embodiments are not limited to the CMOS image sensor, but may be applied to all image sensors including a CCD image sensor.

Example FIG. 1 is a longitudinal-sectional view of an image sensor in accordance with embodiments. With reference to example FIG. 1, the image sensor includes a substrate 110 including photo diodes. An interlayer insulating film is formed on and/or over the substrate 110. A color filter layer 120 is formed on and/or over the interlayer insulating film. The interlayer insulating film provided under the color filter layer 120 includes metal lines. The image sensor further includes circuitry on and/or over the substrate 110 including the photo diodes.

Micro lenses 131 are formed on and/or over the color filter layer 120. A metal buried layer 133 is formed extending vertically with respect to the uppermost surface of the color filter layer 120 in outer edge region of each micro lens 131. In accordance with embodiments, the micro lenses 131 are made of an oxide, for example, silicon oxide ($SiO_2$). At least one metal buried layer 133 is provided at the outer edge region of each micro lens 131. In accordance with embodiments, the metal buried layer 133 passes through the micro lenses 131 from the bottom surface where it contacts the uppermost surface of the color filter layer 120 to the uppermost surface of the micro lenses 131. The metal buried layer 133 is formed by forming trenches at the outer edge regions of the micro lens 131 and filling the trenches with tungsten (W). Consequently, a metal is vertically interposed in the outer edge regions of the micro lenses 131, and thus, serves as a barrier to prevent crosstalk generated between pixels.

Figure 2:
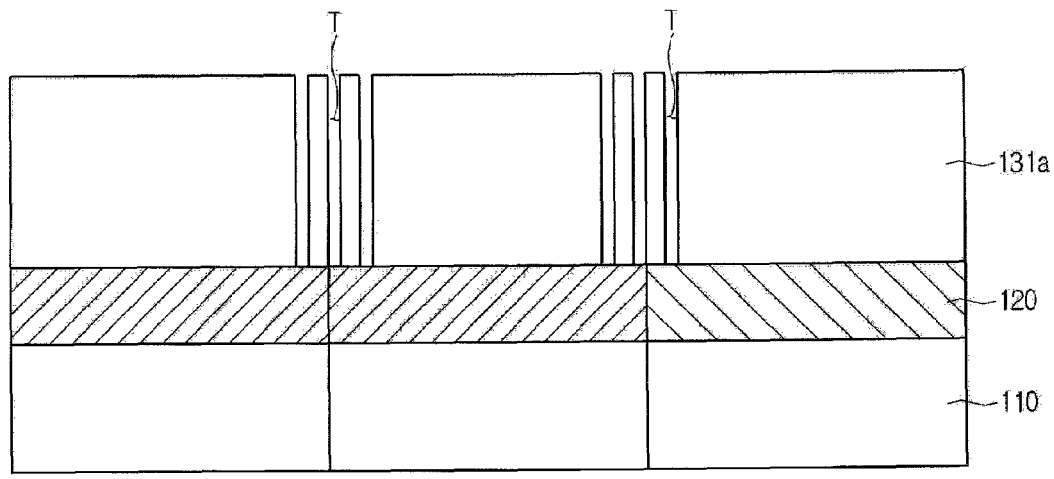
Figure 3:
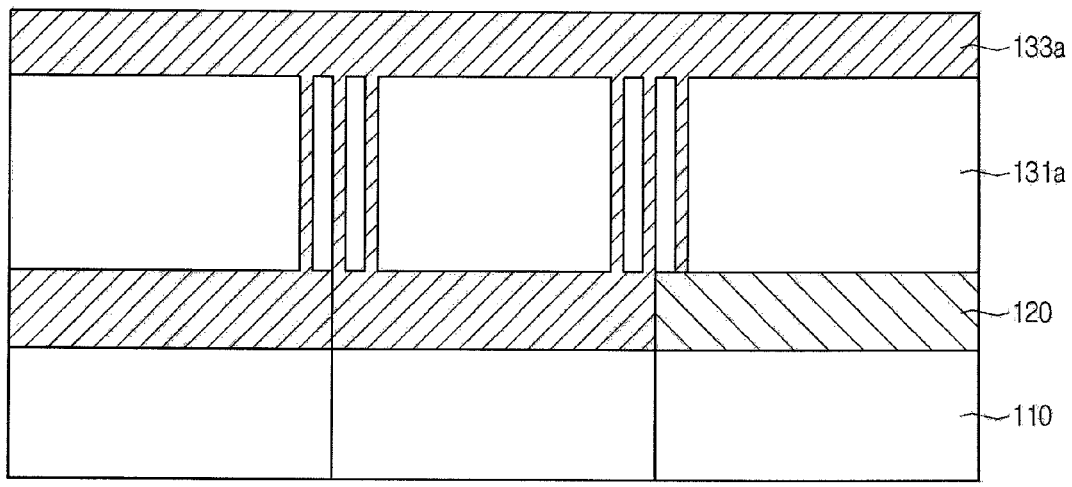
Figure 4:
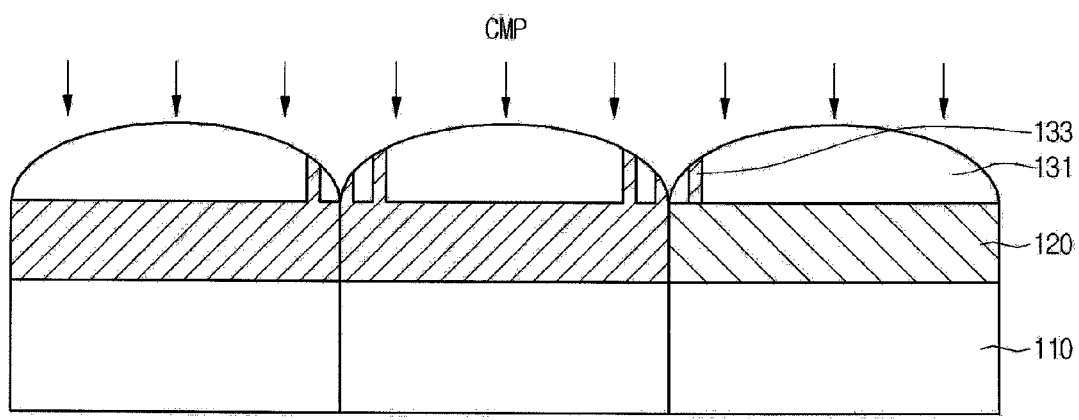

Example FIGS. 2 to 4 are longitudinal-sectional views illustrating a method for manufacturing an image sensor in accordance with embodiments.

With reference to example FIG. 2, an interlayer insulating film is first formed on and/or over the substrate 110 including the photo diodes. For example, the interlayer insulating film has a multilayer structure that includes a first interlayer insulating film formed on and/or over the substrate 110 including the photo diodes, and then a light shielding layer to prevent light from being incident upon regions of the substrate 110 other than photo diode regions and a second interlayer insulating film formed on and/or over the light shielding layer. Thereby, an interlayer insulating film having a multilayer structure is formed. Further, a passivation layer to protect a device from moisture and scratches is formed on and/or over the interlayer insulating film having the multilayer structure.

Thereafter, the color filter layer 120 is formed on and/or over the interlayer insulating film. The color filter layer 120 includes a plurality of R, G, and B color filters which filter light according to respective wavelengths. The color filter layer 120 is formed by applying a dyeable resist to the interlayer insulating film and then performing exposure and development processes. Thereafter, a planarization layer to adjust a focal length and secure flatness for stable formation of the micro lenses 131 is formed on and/or over the color filter layer 120. Then, an oxide film 131a is formed by depositing an oxide on and/or over the planarization layer. The description of the formation of the above planarization layer will be omitted, and the deposition of the oxide to form the micro lenses 131 on and/or over the color filter layer 120 will be described hereinafter.

The oxide may be deposited at a temperature of approximately 200° C. or less, and may be silicon oxide ($SiO_2$). However, the oxide to form the oxide film 131a is not limited to silicon oxide ($SiO_2$). Further, CVD, PVD, or PECVD may be used in the deposition of the oxide. After silicon oxide ($SiO_2$) has been deposited on and/or over the color filter layer 120, a photosensitive film pattern to etch portions of the deposited silicon oxide ($SiO_2$) is formed on and/or over the deposited silicon oxide ($SiO_2$). Here, the photosensitive film pattern serves to selectively etch the portions of the deposited silicon oxide ($SiO_2$) corresponding to the outer edge regions of the micro lenses 131, which will be completed later. The oxide film 131a including at least one trench (T) formed at each of portions thereof is formed by etching using the photosensitive film pattern as an etching mask. Here, the trench (T) is located at a position corresponding to the outer edge region of each of the micro lenses 131. In accordance with embodiments, the trench (T) passes through the oxide film 131a to a depth reaching the uppermost surface of the color filter layer 120 formed under the oxide film 131a.

Thereafter, as shown in example FIG. 3, a metal 133a is deposited on and/or over the oxide film 131a including filling the trenches (T). For example, tungsten (W) fills the trenches (T). However, the metal filling the trenches (T) is not limited to tungsten (W), and any metal having a good gap-fill ability may be used in accordance with embodiments.

Thereafter, as shown in example FIG. 4, the micro lenses 131 provided with the metal vertically interposed in the outer edge portions thereof are formed by polishing the oxide film 131a filled with the metal. CMP is used to polish the oxide film 131a, and a slurry for metal is used to perform the CMP. By using the slurry for metal, the outer edge regions of the oxide film 131a provided with the metal vertically interposed therein are preferentially removed, thus forming the micro lenses 131 having a convex shape. Since the outer edge regions of the micro lenses 131, which are made of both the oxide and the metal, are more removed than the central regions of the micro lenses 131, which are made of only the oxide, by using the slurry for metal, it is possible to form the convex micro lenses 131. In accordance with embodiments, since the micro lenses 131 are made of an oxide instead of an organic material, foreign substances generated during a subsequent process may not affect the lenses. Further, the use of a metal formed in the microlenses is provided between neighboring micro lenses, and thus prevents crosstalk.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A device comprising:
   an interlayer insulating film formed over a substrate including photo diodes;
   a color filter layer formed over the interlayer insulating film;
   a micro lens array formed over the color filter layer; and
   a metal layer vertically extending through each microlens in the microlens array.

2. The device of claim 1, wherein each microlens in the microlens array is composed of an oxide material.

3. The device of claim 2, wherein the oxide material comprises silicon oxide ($SiO_2$).

4. The device of claim 1, wherein the metal layer is formed at an outer edge region of each microlens in the microlens array.

5. The device of claim 4, wherein the metal layer extends through each microlens in the microlens array from a bottommost surface thereof to an uppermost surface thereof.

6. The device of claim 5, wherein the metal layer contacts the uppermost surface of the color filter layer.

7. The device of claim 1, wherein the metal layer extends through each microlens in the microlens array from an uppermost surface thereof to a bottommost surface thereof where it contacts the uppermost surface of the color filter layer.

8. The device of claim 1, wherein the metal layer is composed of tungsten.

9. A device comprising:
   a semiconductor substrate having a photodiode;
   a color filter formed over the photodiode;
   a micro lens formed over the color filter layer;
   at least one metal layer formed vertically extending through the microlens at an outer edge thereof.

10. The device of claim 9, wherein the microlens is composed of an oxide material.

11. The device of claim 10, wherein the oxide material comprises silicon oxide ($SiO_2$).

12. The device of claim 9, wherein the at least one metal layer comprises a first metal layer and a second metal layer spaced apart from the first metal layer.

13. The device of claim 12, wherein the first and second metal layers each extend through the microlens from a bottommost surface thereof to an uppermost surface thereof.

14. The device of claim 13, wherein the first and second metal layer contacts the uppermost surface of the color filter layer.

15. The device of claim 1, wherein the at least one metal layer is composed of tungsten.

16. A method comprising:

providing a semiconductor substrate having a photodiode; and then forming a color filter over the photodiode; and then forming a micro lens over the color filter; and then forming at least one metal layer vertically extending through the microlens at an outer edge thereof.

17. The method of claim 16, wherein forming the micro lens comprises:

depositing an oxide layer over the color filter layer; and then forming at least one trench at an outer edge portion of the oxide layer.

18. The method of claim 17, wherein forming the at least one metal layer comprises:

filling the at least one trench with a metal material; and then polishing the oxide layer filled with the metal material.

19. The method of claim 17, wherein the oxide layer comprises silicon oxide ($SiO_2$).

20. The method of claim 16, wherein the at least one metal layer extends through the microlens from a bottommost surface thereof to an uppermost surface thereof and contacts the uppermost surface of the color filter.

\* \* \* \* \*